United States Patent
Simmons-Matthews et al.

(10) Patent No.: US 8,227,295 B2
(45) Date of Patent: Jul. 24, 2012

(54) IC DIE HAVING TSV AND WAFER LEVEL UNDERFILL AND STACKED IC DEVICES COMPRISING A WORKPIECE SOLDER CONNECTED TO THE TSV

(75) Inventors: Margaret R. Simmons-Matthews, Richardson, TX (US); Donald C. Abbott, Norton, MA (US)

(73) Assignee: Texas Instruments Incorporated, Dallas, TX (US)

( * ) Notice: Subject to any disclaimer, the term of this patent is extended or adjusted under 35 U.S.C. 154(b) by 596 days.

(21) Appl. No.: 12/416,694

(22) Filed: Apr. 1, 2009

(65) Prior Publication Data
US 2010/0096738 A1    Apr. 22, 2010

Related U.S. Application Data

(60) Provisional application No. 61/106,065, filed on Oct. 16, 2008.

(51) Int. Cl.
*H01L 21/00* (2006.01)
(52) U.S. Cl. .......... 438/109; 438/654; 438/624
(58) Field of Classification Search .......... 438/109, 438/654, 624
See application file for complete search history.

(56) References Cited

U.S. PATENT DOCUMENTS

| | | | |
|---|---|---|---|
| 6,153,518 A * | 11/2000 | Abbott et al. | 438/672 |
| 6,162,718 A * | 12/2000 | Boettcher | 438/613 |
| 6,723,597 B2 * | 4/2004 | Abbott et al. | 438/238 |
| 6,780,673 B2 * | 8/2004 | Venkateswaran | 438/108 |
| 6,929,975 B2 * | 8/2005 | Heinz et al. | 438/106 |
| 7,179,738 B2 * | 2/2007 | Abbott | 438/654 |
| 7,275,298 B2 * | 10/2007 | Schindel | 29/594 |
| 7,411,303 B2 * | 8/2008 | Abbott | 257/762 |
| 7,504,716 B2 * | 3/2009 | Abbott | 257/678 |
| 7,514,290 B1 * | 4/2009 | Sakuma et al. | 438/108 |
| 7,833,895 B2 * | 11/2010 | Bonifield et al. | 438/598 |
| 7,943,514 B2 * | 5/2011 | West | 438/667 |
| 7,973,407 B2 * | 7/2011 | Ramanathan et al. | 257/737 |
| 8,039,385 B1 * | 10/2011 | West et al. | 438/613 |
| 8,143,704 B2 * | 3/2012 | West | 257/621 |
| 8,154,134 B2 * | 4/2012 | Bonifield et al. | 257/774 |
| 2003/0100176 A1 * | 5/2003 | Kim et al. | 438/624 |
| 2006/0017151 A1 * | 1/2006 | Yoon et al. | 257/700 |
| 2006/0279000 A1 * | 12/2006 | Chang et al. | 257/779 |
| 2007/0111516 A1 * | 5/2007 | Abbott | 438/624 |
| 2009/0121348 A1 * | 5/2009 | Chang | 257/737 |
| 2009/0140420 A1 * | 6/2009 | Farooq et al. | 257/737 |
| 2009/0236756 A1 * | 9/2009 | Kim et al. | 257/778 |
| 2009/0278238 A1 * | 11/2009 | Bonifield et al. | 257/621 |

(Continued)

*Primary Examiner* — Laura Menz
(74) *Attorney, Agent, or Firm* — Steven A. Shaw; W. James Brady; Frederick J. Telecky, Jr.

(57) ABSTRACT

A method of forming integrated circuit (IC) die configured for attachment to another die or a package substrate, and stacked IC devices therefrom. At least one IC die having a top semiconductor surface and a bottom surface and at least one through substrate via (TSV) including a tip protruding beyond the bottom surface to a tip length is provided. The tip has an outer dielectric tip liner, and an electrically conductive portion within the outer dielectric tip liner. A compliant layer is applied to the bottom surface of the IC die. The dielectric tip liner is removed from a distal portion of the tip to expose an electrically conductive tip portion. A solder material is deposited on the exposed distal portion of the tip. The solder material is reflowed and coalesced to form a solder bump on the distal portion of the tip.

11 Claims, 8 Drawing Sheets

U.S. PATENT DOCUMENTS

| | | | |
|---|---|---|---|
| 2009/0278244 A1* | 11/2009 | Dunne et al. | 257/676 |
| 2009/0278245 A1* | 11/2009 | Bonifield et al. | 257/676 |
| 2010/0096738 A1* | 4/2010 | Simmons-Matthews et al. | 257/686 |
| 2010/0171226 A1* | 7/2010 | West et al. | 257/774 |
| 2010/0190294 A1* | 7/2010 | Simmons-Matthews | 438/108 |
| 2011/0018107 A1* | 1/2011 | Bonifield et al. | 257/621 |
| 2011/0049717 A1* | 3/2011 | West | 257/751 |
| 2011/0079916 A1* | 4/2011 | West | 257/774 |
| 2011/0187000 A1* | 8/2011 | West | 257/751 |
| 2011/0266693 A1* | 11/2011 | Simmons-Matthews | 257/774 |
| 2011/0272814 A1* | 11/2011 | Wachtler et al. | 257/773 |
| 2011/0291263 A1* | 12/2011 | West | 257/737 |

* cited by examiner

IC DIE HAVING TSV AND WAFER LEVEL UNDERFILL AND STACKED IC DEVICES COMPRISING A WORKPIECE SOLDER CONNECTED TO THE TSV

CROSS REFERENCE TO RELATED APPLICATIONS

This application claims the benefit of Provisional Application Ser. No. 61/106,065 entitled "Semiconductor Packages", filed Oct. 16, 2008, which is herein incorporated by reference in its entirety.

FIELD OF THE INVENTION

Embodiments of the present invention relate to integrated circuits (IC) devices having through substrate vias and packaged ICs.

BACKGROUND

Some ICs include through silicon vias (TSVs) which are also referred to as through wafer vias (TWS). Due to their considerably shorter length as compared to conventional wire bond connections, TSVs reduce inductance and resistance and thus improve IC performance.

As known in the art of semiconductor package assembly, in conventional assembly processing for ICs that comprise TSVs, solder regions are applied to the workpiece which can comprise a package substrate (e.g. printed circuit board (PCB)) or other IC die. The IC is aligned such that the TSV tips are aligned to the solder regions, followed by attachment to the workpiece. Underfill is then generally applied after attachment.

SUMMARY

The Present Inventors have realized that assembly of IC die having a plurality of TSVs including some relatively fine pitched TSVs having a small stand-off distance between the IC die and the workpiece (e.g., package substrate or other IC die) that they are attached to, generally makes conventional underfill processing difficult. As a result, underfill voids generally result. Moreover, the very small size of the TSVs (e.g., 10 to 30 µm diameter, or less) renders them difficult to attach to a workpiece using conventional approaches that rely on a solder coating on the workpiece. Moreover, since the attach pads of the workpiece are typically larger in area as compared to the TSV cross sectional area dimension (e.g., diameter), solder volume is difficult to control, often resulting in shorts between neighboring TSVs (e.g., when there is too much solder) or open connections (e.g., when there is not enough solder).

As used herein, the term "TSV" is defined broadly to include any wafer or IC die having a through via filled with an electrically conductive material (e.g., metal such as copper or tungsten or a degeneratively doped semiconductor such as n+ or p+ silicon). The substrate can be a silicon comprising substrate, such as a bulk silicon, silicon germanium, or a silicon on insulator (SOI) substrate. The filled via provides an electrical contact that extends from the bottom of the wafer or IC die and extends to the contact level or any of the metal interconnect levels on the top side wafer or die surface. The TSVs can generally be formed by either via first or a via last processing.

Embodiments of the present invention describe processing comprising applying a compliant layer at the wafer level as part of the TSV exposure process, thus eliminating the need to apply conventional underfill at the package level. This aspect of embodiments of the invention eliminates the above-described difficulty in filling small gaps, and eliminates a package level process step which is typically low throughput, thus reducing assembly time and reducing cost.

A relatively small and controlled amount of a solder material is applied to the distal end of the TSV tip at the wafer or die level which is then used to create the solder joint during the package assembly process. Better control of the amount of solder applied provided by embodiments of the invention have been found to improve joint formation leading to fewer shorted or open connections as compared to conventional processing. Generally, a photodefinable masking material is applied at the die or wafer level to deposit a small, well controlled amount of solder on the distal end of each TSV tip. The masking material is allowed to remain behind (non-sacrificial) and serves as underfill in the final device between the IC die containing the TSV and the workpiece that generally comprises another die or a package substrate. Embodiments of the invention generally include solder reflow processing. Reflow of the solder allows a very thin applied or a small solder ball to coalesce into a thicker dome shaped solder bump which facilitates die alignment and solder joint formation.

Assembled IC comprising stacked devices according to embodiments of the invention have several unique features. No redistribution layer is used to connect the TSV's to pads of the workpiece which are then the solder terminals. The compliant layer added at the wafer or die level that functions as underfill material is generally bounded to be within the periphery of the die. Moreover, the solder joint connecting TSV to the workpiece is generally $\leq$ to the area (e.g., diameter) of the distal end of the TSV tip.

DETAILED DESCRIPTION

Figure 1:
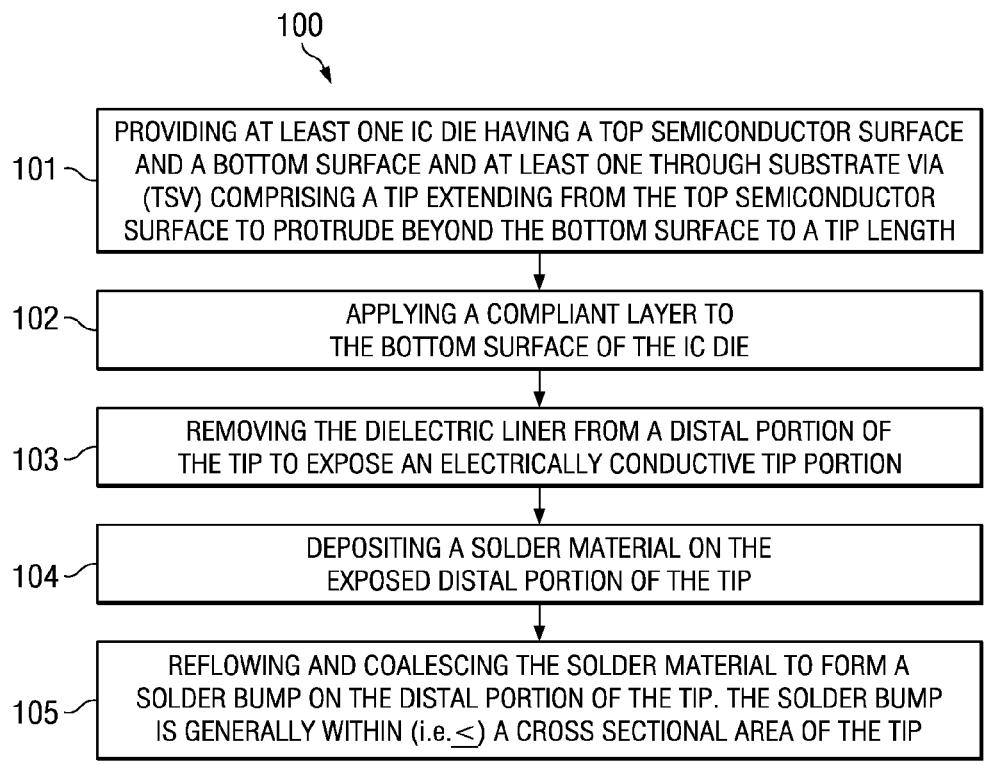
FIG. 1 shows steps in a method of forming IC die having localized solder on distal ends of the TSV tips, yet within the tip area, and a compliant layer lateral to the TSV tips, according to a first embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

FIG. 1 shows steps in an exemplary method 100 of forming an IC die having localized solder material on distal end of the TSV tips, yet being within the tip area, and a compliant layer lateral to the TSV tips, according to a first embodiment of the invention. Although the TSVs are generally herein described as having a circular cross section, thus having a characterizable radius and diameter, the TSV may take on other shapes, such as rectangular, annular, or a variety of irregular shapes. For non-circular cross sectioned TSVs, the same localized solder material on distal end of the TSV tips yet being within the tip area can be obtained using embodiments of the invention as described below.

Step 101 comprises providing at least one IC die having a top semiconductor surface and a bottom surface and at least one TSV comprising a tip extending from the top semiconductor surface to protrude beyond the bottom surface to a tip length. The TSV may terminate at the top semiconductor surface anywhere from contact through metal level n (n metal levels in a multi-layer metal process). In one embodiment of the invention a wafer provides a plurality of IC die, such as a Si wafer. The tip has an outer dielectric liner, and there is an electrically conductive portion within the outer dielectric liner. In the case of copper, as known in the art, a barrier layer and a seed layer are also provided.

Step 102 comprises applying a compliant layer to the bottom surface of the IC die. The compliant layer is generally a polymer comprising layer. The compliant layer is generally thicker as compared to the tip length, but can also be thinner than the tip length (see the embodiment described below with regard to FIGS. 4A-F). The compliant layer can also serve to "mask" the vertical sides of the exposed tip of the TSV to prevent loss of solder from the tip joint area due to wetting of solder down the sides of the exposed tip. Examples of compliant layers that can be used include solder resist similar to that used on a printed circuit board (e.g., epoxy-based), liquid plating resist similar to that used in selective plating processes, Polyimide (PI) and Polybenzoxazole (PBO). In one embodiment, the compliant layer can include silicon filler, with a concentration of silicon filler selected to obtain a desired coefficient of thermal expansion (CTE) for matching to silicon in the case of silicon substrates.

In step 103, the dielectric liner is removed from a distal portion of the tip to expose an electrically conductive tip portion. A variety of removal processes can be used for this purpose, such as a dry etch process. In embodiments where the compliant layer is thicker as compared to the tip length, a process step is added to expose the dielectric liner on a distal portion of the tip before step 103, such as a step to thin the compliant layer.

Step 104 comprises depositing a solder material on the exposed distal portion of the tip. A small, controlled amount of solder is applied to the distal end of the TSV tip. The thickness range for the solder layer to form a solder bump exclusively on the tip can be based on parameters including the radius of the distal end of the TSV as described in more detail below. Generally, the thickness of the solder layer for embodiments of the invention is <3 µm, and in some embodiments is <1 µm. Tight control of the amount of solder applied through controlling the thickness and area (and thus the volume) of the solder material will improve joint formation at assembly and has been found to lead to fewer shorted or open connections.

As described below, the depositing of a solder material on the exposed distal end of the tip can be performed by a variety of processes including electroless plating, electrolytic plating (electroplating), or solder ball placement. Electroplating generally requires making electrical contact to the tip to make it cathodic, making electroless plating in comparison a generally a simpler process. In the seed layer embodiment described relative to FIGS. 4A-F below, the seed layer makes electrical contact to the tip(s) to allow electroplating.

Step 105 comprises reflowing and coalescing the solder material to form a solder bump on the distal end of the tip. The resulting solder bump is generally within (i.e., ≦to)—a cross sectional area of the tip. Reflow of the solder allows a very thin applied layer in certain embodiments or a small solder ball in another embodiment to coalesce into a thicker dome shaped solder bump which facilitates die alignment and solder joint formation.

The solder bumped IC die is ready for assembly to another IC die or package substrate (e.g., PCB). The solder bumps are used to form solder joints to contact the distal end of the TSVs, rather than conventional processing that relies on the solder to be supplied by the other surface the via tip is attached to (i.e., substrate or other die). Since the compliant layer is applied at the wafer or die level acts as an underfill layer for embodiments of the invention, the need for an underfilling step at the package assembly level is eliminated. Moreover, the reflow of the solder coating into a bump that is generally dome shaped allows the use of very thin applied solder layers or small solder balls.

FIGS. 2A-I show successive cross sectional representations associated with steps in a method for forming IC die having localized solder on distal end of the TSV tips, yet within the tip area, and a compliant layer lateral to the TSV tips, according to a first embodiment of the invention. The wafer or die 205 shown in FIG. 2A has at least one TSV 210 having an outer dielectric liner 211 and an electrically conductive portion 212 within the outer dielectric liner 211. The TSV 210 may have an exemplary diameter of 10 to 30 µm, such as 10 to 15 µm. In one embodiment, a via-first process is used whereby the TSV 210 is first etched from the topside of wafer 205, lined with the outer dielectric liner 211 (e.g., silicon oxide), and is then filled with an electrically conductive material 212 such as copper via plating. Barrier and seed layer processing generally precede plating.

Figures 2A, 2B:
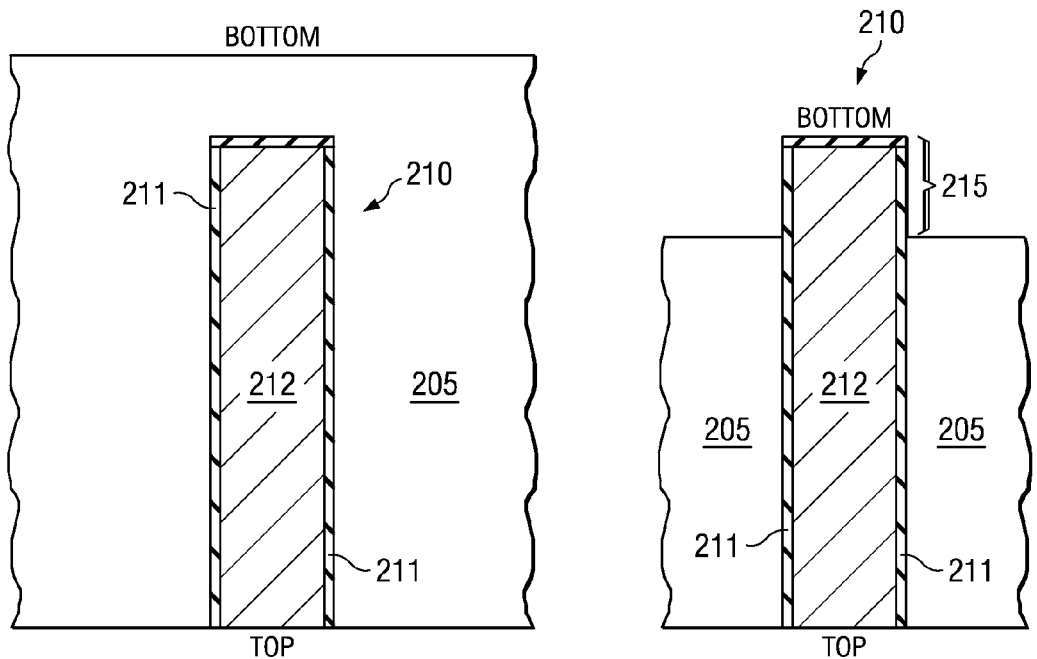
FIGS. 2A-I show representations of successive steps for a method of forming an IC die having localized solder on distal end of the TSV tips, yet being within the tip area, and a compliant layer lateral to the TSV tips, according to a first embodiment of the invention.
Figure 2C:
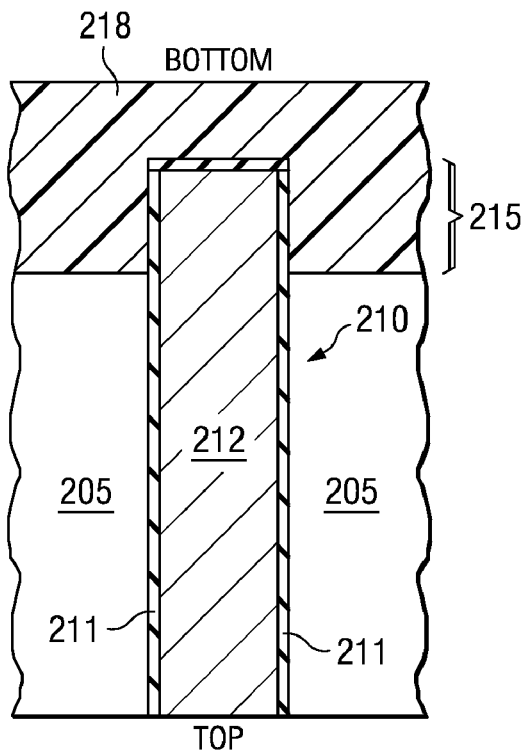
Figure 2D:
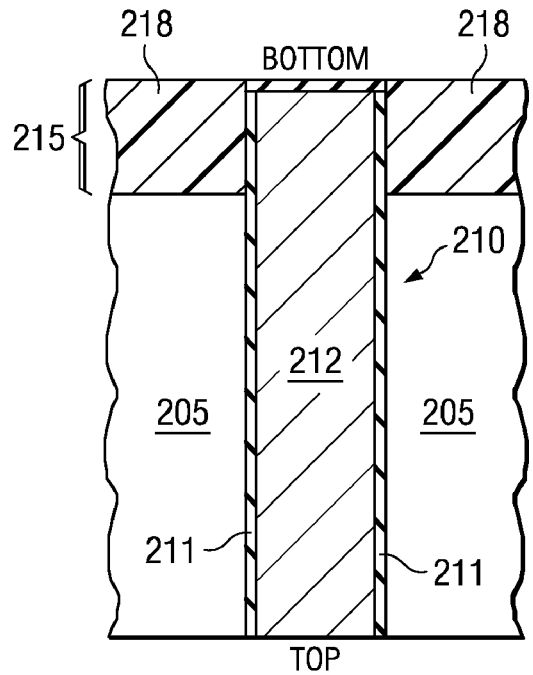
Figure 2E:
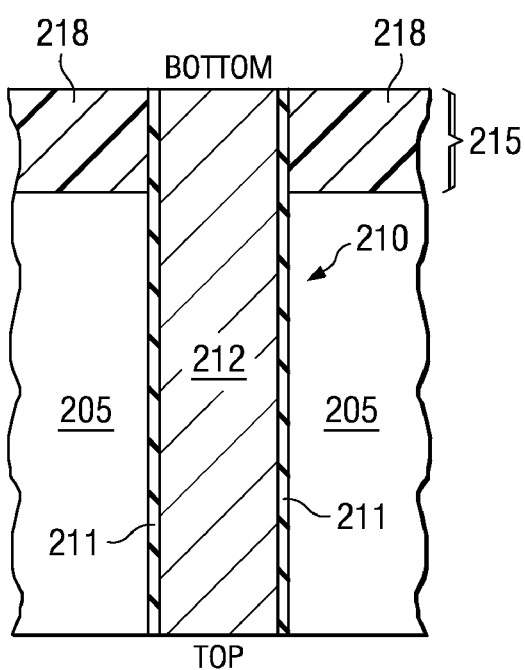

FIG. 2B shows a cross section following backgrind and chemical etch of the bottom of the wafer 205 to expose a TSV tip 215. The tip 215 can be a variety of lengths generally being 5 to 50 μm long, such as 10 to 30 μm long. FIG. 2C shows a cross section following depositing a compliant layer 218 having a thickness thicker than the length of the exposed tip using a process appropriate for the particular compliant material. FIG. 2D shows a cross section following thinning of the compliant layer 218, using a process appropriate to the material. FIG. 2E shows a cross section following removal of the TSV tip liner to expose the electrically conductive portion (e.g., Cu) 212 at the distal end of the tip 215, using a process appropriate to the liner material.

Figure 2F:
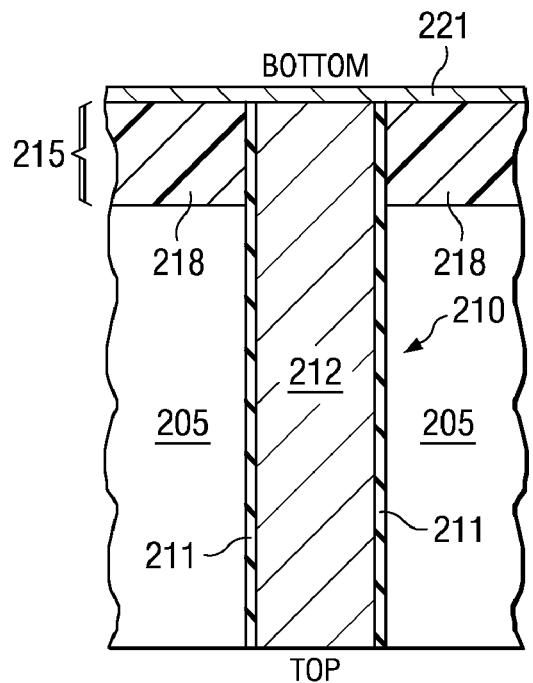
Figure 2G:
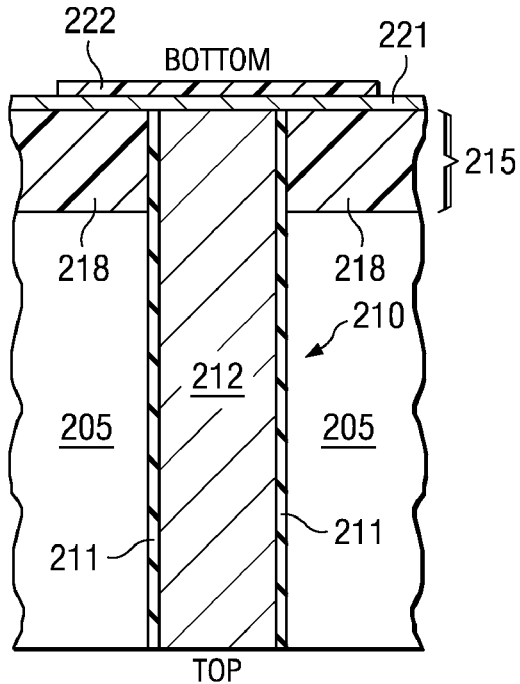
Figure 2H:
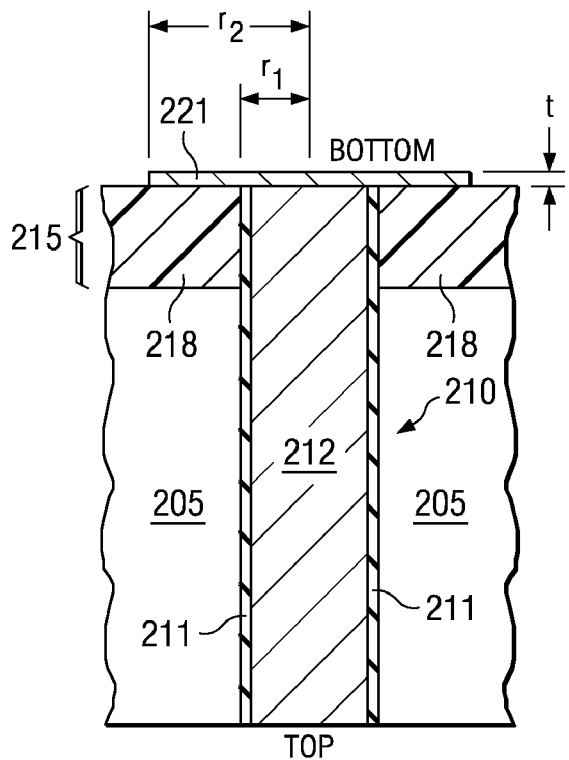
Figure 2I:
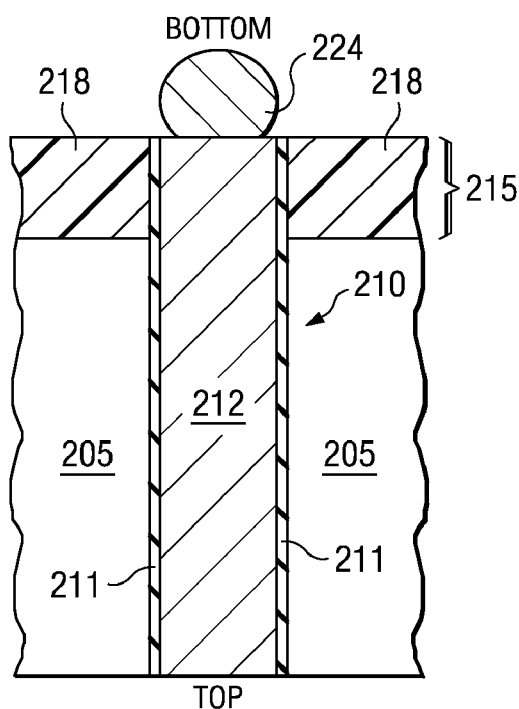

FIG. 2F shows a cross section following plating (e.g. electrolessly) a thin layer of solder material 221 on the bottom side of the wafer 205. The exemplary target thickness range for solder layer 221 is described below. FIG. 2G shows a cross section following applying a masking layer such as photoresist and patterning the masking layer to provide features 222 to protect solder material layer 221 over TSV 210. FIG. 2H shows a cross section following etch of the solder material layer 221 using the photoresist feature as a mask and after removing the photoresist feature 222. Parameter $r_1$ is shown as the radius of the TSV tip 215, parameter $r_2$ as the radius of the patterned solder layer 221 (before reflow), and t as the thickness of the solder layer 221 (before reflow). FIG. 2I shows a cross section following reflow and coalescing the solder material 221 to form a solder bump 224 on the exposed (electrically conductive) distal end of the TSV tip 215. Following reflow and coalescing the resulting solder bump 224 can be seen to be entirely within radius of the TSV tip 215 shown as $r_1$.

For the embodiment shown, an exemplary target thickness (t) range for solderable layer 221 shown in FIG. 2F after plating can be found using parameters $r_1$ and $r_2$ defined above. A minimum thickness (tmin) assuming a 25% sphere of solder material after reflow to form solder bump 224 is found by calculating tmin=$r_1^3/3r_2^2$. A maximum thickness (tmax) assuming a 75% sphere of solder material after reflow is found by calculating tmax=$r_1^3/r_2^2$.

Figure 3A:
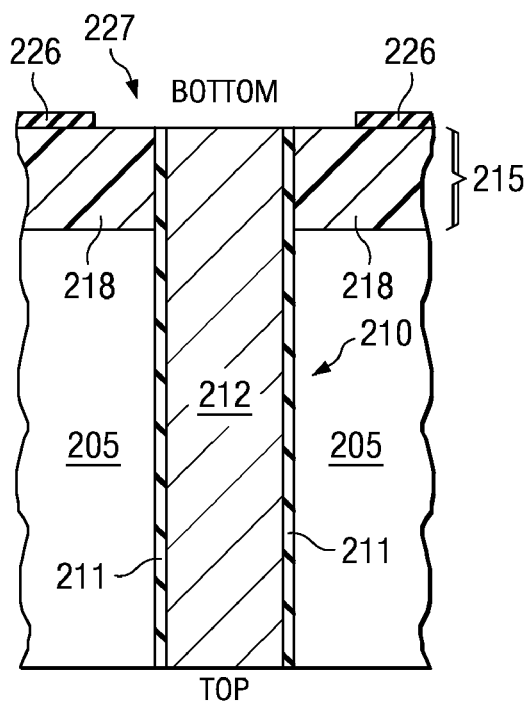
FIGS. 3A and B show a variant of the method for forming IC die having localized solder on distal end of the TSV tips shown in FIGS. 2A-I, according to a first embodiment of the invention.
Figure 3B:
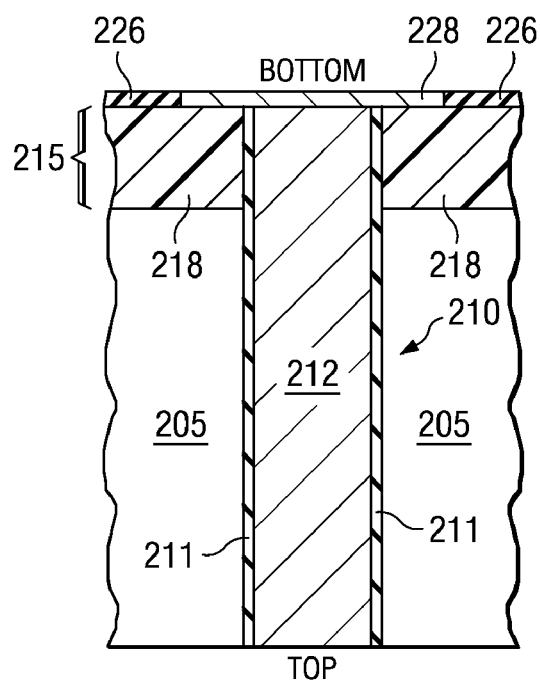
Figure 4A:
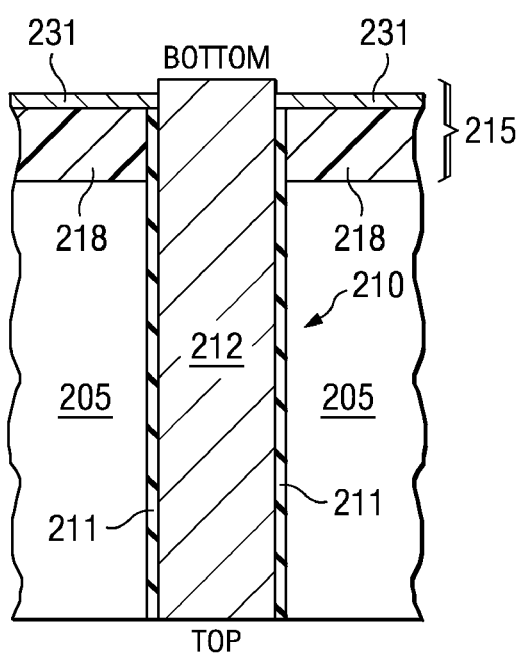
FIGS. 4A-F show successive cross sectional representations associated with steps in a method for forming IC die having localized solder on distal end of the TSV tips, yet being within the tip area, and a compliant layer lateral to the TSV tips, according to another embodiment of the invention.
Figure 4B:
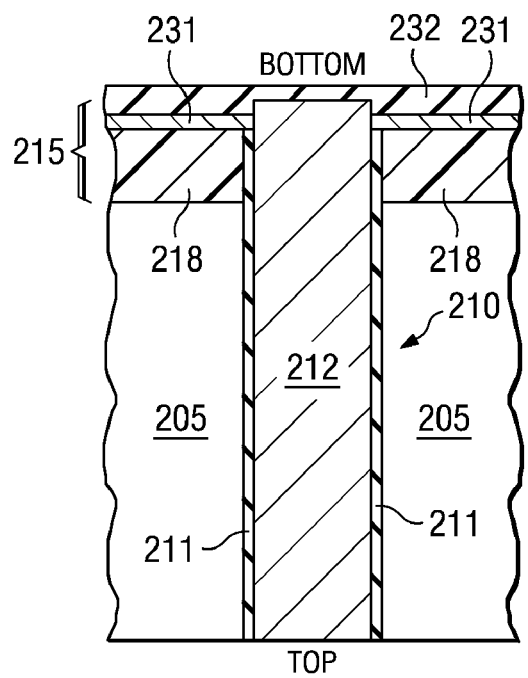
Figure 4C:
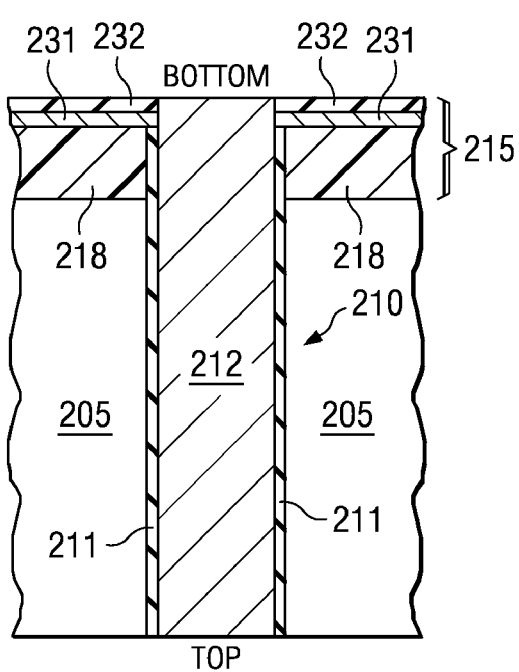
Figure 4D:
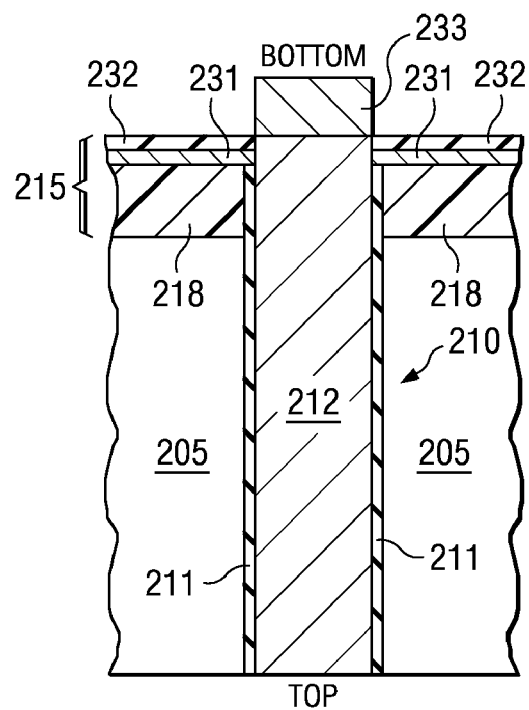
Figure 4E:
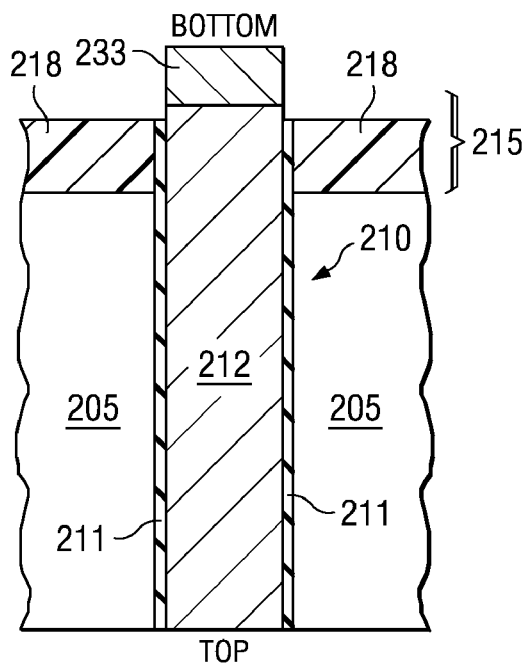
Figure 4F:
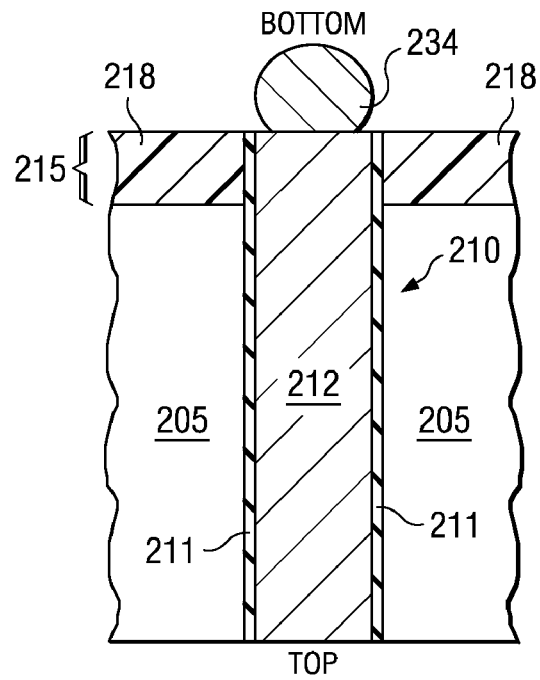

A variant of the method for forming IC die having localized solder on the distal end of the TSV tips, yet within the tip area, and a compliant layer lateral to the TSV tips shown in FIGS. 2A-I, is shown in FIGS. 3A-B. Beginning with the cross section shown in FIG. 2E, a masking layer 226 such as photoresist is deposited on the IC die or wafer 205 and a patterned open feature 227 over the TSV tip 215 is formed that has a dimension that is larger than the dimension (e.g., diameter) of the TSV tip 215, resulting in the cross section shown in FIG. 3A. A thin layer of solder material 228 is then deposited (e.g., electrolessly plated) in the patterned open feature 227, with the resulting cross section shown in FIG. 3B. The masking layer 226 is removed followed by reflow and coalescing the solder material 228 to form a solder bump 224 to result in a structure analogous to that shown in FIG. 2I.

FIGS. 4A-F show successive cross sectional representations associated with steps in a method for forming IC die having localized solder on the distal end of the TSV tips, yet within the tip area, and a compliant layer lateral to the TSV tips, according to another embodiment of the invention. Beginning with the cross section shown in FIG. 2E modified only so that the compliant layer 218 is now thinner as compared to the length of the TSV tip 215, a thin blanket seed layer 231 (e.g., copper) is formed on the bottom surface of the wafer or die 205 with the resulting cross section shown in FIG. 4A. A dielectric layer 232 is then formed over the seed layer 231 with the resulting cross section shown in FIG. 4B. Following grinding or polishing the dielectric layer 232 with an appropriate process to expose the electrically conductive material 212 of the TSV tip 215 results in the cross section shown in FIG. 4C. Solder material 233 is then electroplated on the exposed distal end of the TSV tip 215 using the dielectric layer 232 as mask and the seed layer 231 as a plating bus resulting in the cross section shown in FIG. 4D. Although the solder material 233 is shown rectangular shaped in FIG. 4D, the shape is more generally hill shaped, unless a photo-imagable plating resist is used to allow thickness build-up. In one embodiment the dielectric layer 232 is plating resist and the TSV tip 215 is exposed by developing the resist, so that only the resist directly over the TSV tip 215 is removed. In this embodiment, the thickness of the resist defines the height of the solder material 233 after plating. The dielectric layer 232 and seed layer 231 are stripped off with appropriate processes resulting in the cross section shown in FIG. 4E. Following reflow and coalescing of the solder material 233 as shown in the cross section of FIG. 4F a solder bump 234 is formed on the exposed distal end of the TSV tip 215. If the solder material 233 as plated and patterned has a radius dimension r, then the thickness range can be found to be r/3 (25% sphere after reflow) to r (75% sphere after reflow).

Figure 5A:
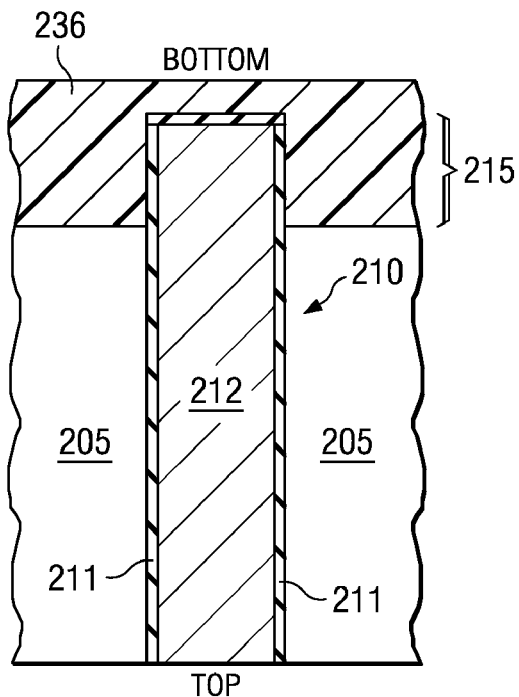
FIGS. 5A-E show successive cross sectional representations associated with steps in a method for forming IC die having localized solder on distal end of the TSV tips, yet being within the tip area, and a compliant layer lateral to the TSV tips, according to yet another embodiment of the invention.
Figure 5B:
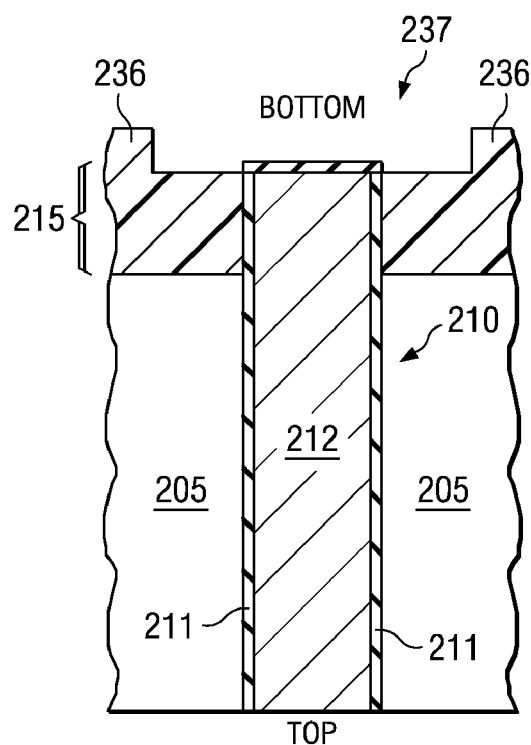
Figure 5C:
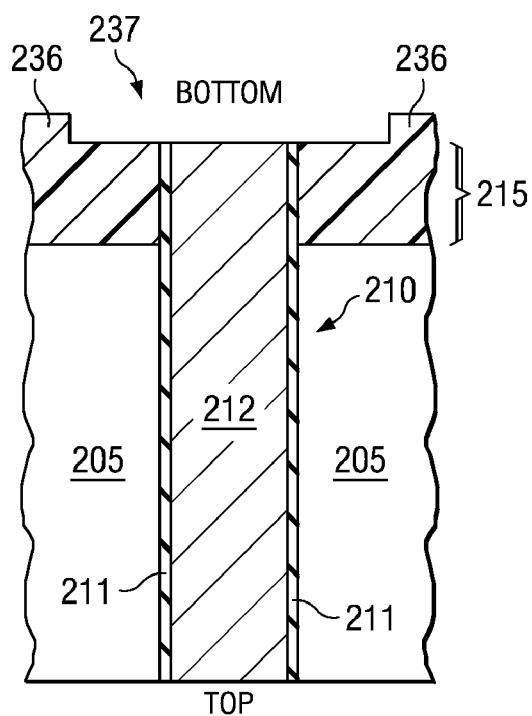
Figure 5D:
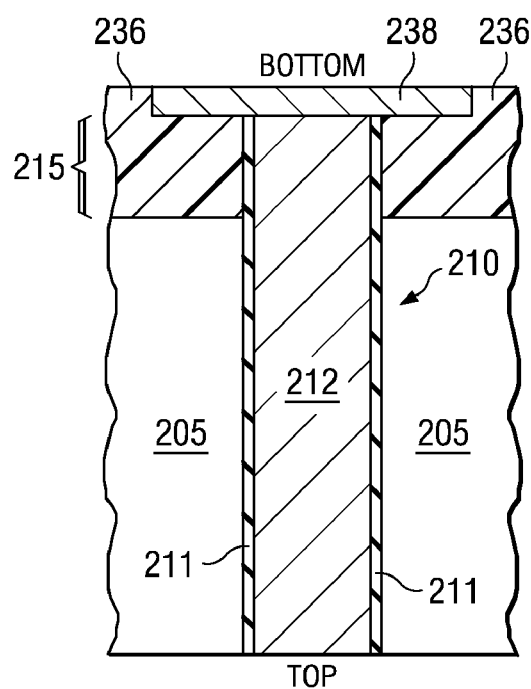
Figure 5E:
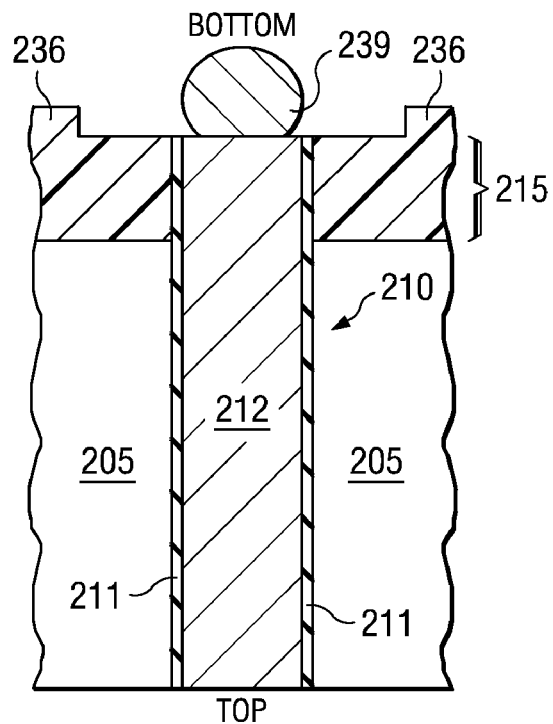

FIGS. 5A-E show successive cross sectional representations associated with steps in a method for forming IC die having localized solder on the distal end of the TSV tips, yet within the tip area, and a compliant layer lateral to the TSV tips, according to another embodiment of the invention. Beginning with the cross section shown in FIG. 2B, FIG. 5A shows a cross section following depositing a compliant (e.g. polymer comprising) layer 236 having a thickness thicker than the length of the exposed tip 215 using a process appropriate for the particular compliant material. FIG. 5B shows a cross section following laser opening a feature 237 in the compliant layer 236 over the TSV tip 215. The TSV tip liner 211 is then removed, using a process appropriate to the liner material with the result shown in FIG. 5C. A thin layer of a solder material 238 is deposited (e.g., electrolessly plated or applied in a paste form in the opening 237 that had been in the compliant layer 236 resulting in the cross section shown in FIG. 5D. Following reflow and coalescing of the solder material 238 as shown in the cross section of FIG. 5E a solder bump 239 is formed on the exposed distal end of the TSV tip 215. Using parameters $r_1$ and $r_2$ defined above relative to FIG. 2H, a minimum thickness (tmin) assuming a 25% sphere of solder material after reflow to form solder bump 224 is found by calculating tmin=$r_1^3/3r_2^2$. A maximum thickness (tmax) assuming a 75% sphere of solder material after reflow is found by calculating tmax=$r_1^3/r_2^2$.

Figure 6A:
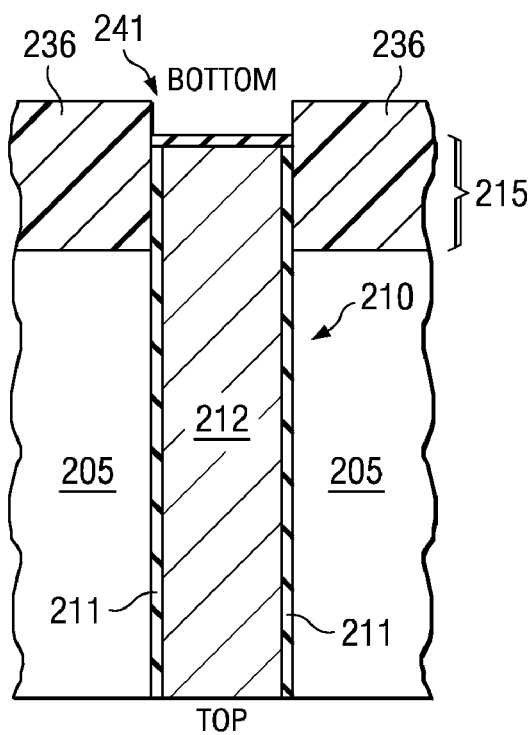
FIGS. 6A-D show a variant of the method for forming IC die having localized solder on distal end of the TSV tips shown in FIGS. 5A-E, including deposition of solder balls, according to yet another embodiment of the invention.
Figure 6B:
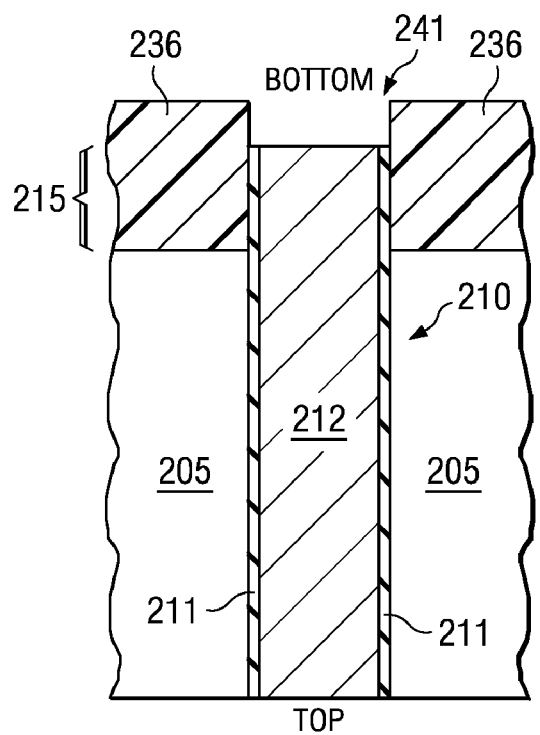
Figure 6C:
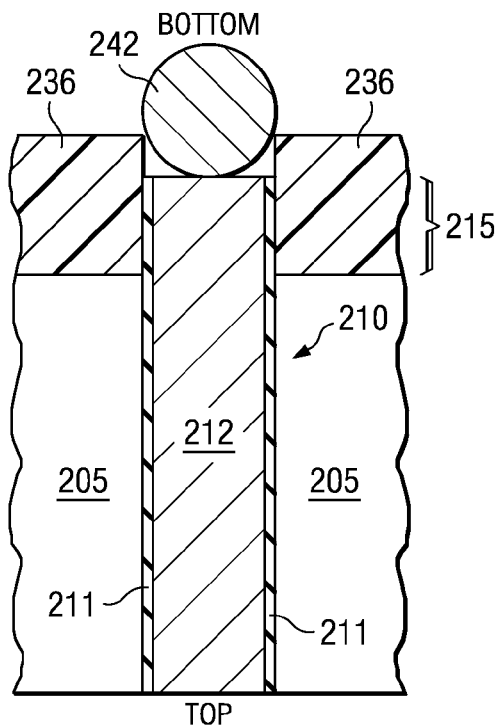
Figure 6D:
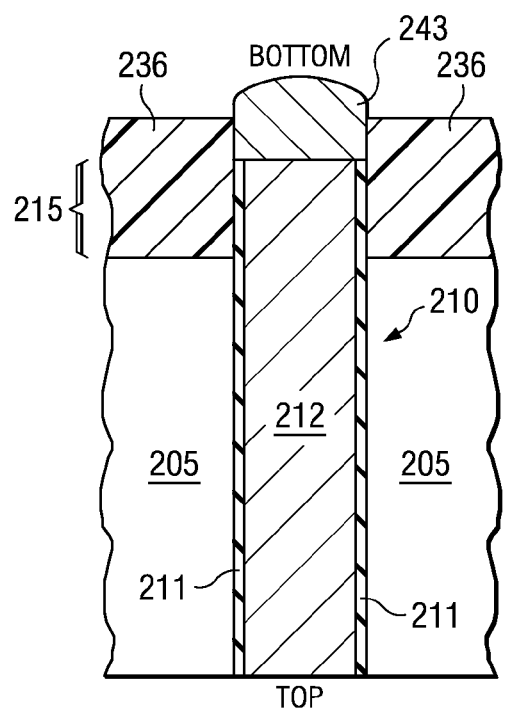

A variant of the method for forming IC die having localized solder on the distal end of the TSV tips, yet within the tip area, and a compliant layer lateral to the TSV tips, shown in FIGS. 5A-E, is shown as FIGS. 6A-D. Beginning with the cross section shown in FIG. 5A, the compliant layer 236 is laser opened over the TSV tip 215 to form open feature 241. The opening 241 is approximately the same (e.g., within 40%) of the area dimension (e.g., diameter) as the TSV tip 215 as shown in FIG. 6A. The TSV tip liner 211 is removed, using a process appropriate to the liner material, resulting in the cross section shown in FIG. 6B. A solder ball 242 is placed in the opening in the compliant layer 236, resulting in the cross section shown in FIG. 6C. FIG. 6D shows the resulting cross section after reflow and coalescing the solder ball 242 to form a solder bump 243 on the exposed TSV tip 215. Using the $r_1$ parameter defined above and $r_2$ as the radius of the solder ball 242, the min radius ($r_2$ min) of the solder ball 242 for a 25% sphere after reflow can be found to be $(r_1^3/4)^{1/3}$ and the maximum radius ($r_2$max) of the solder ball 242 for a 75% sphere after reflow can be found to be $(3r_1^3/4)^{1/3}$.

Figure 7:
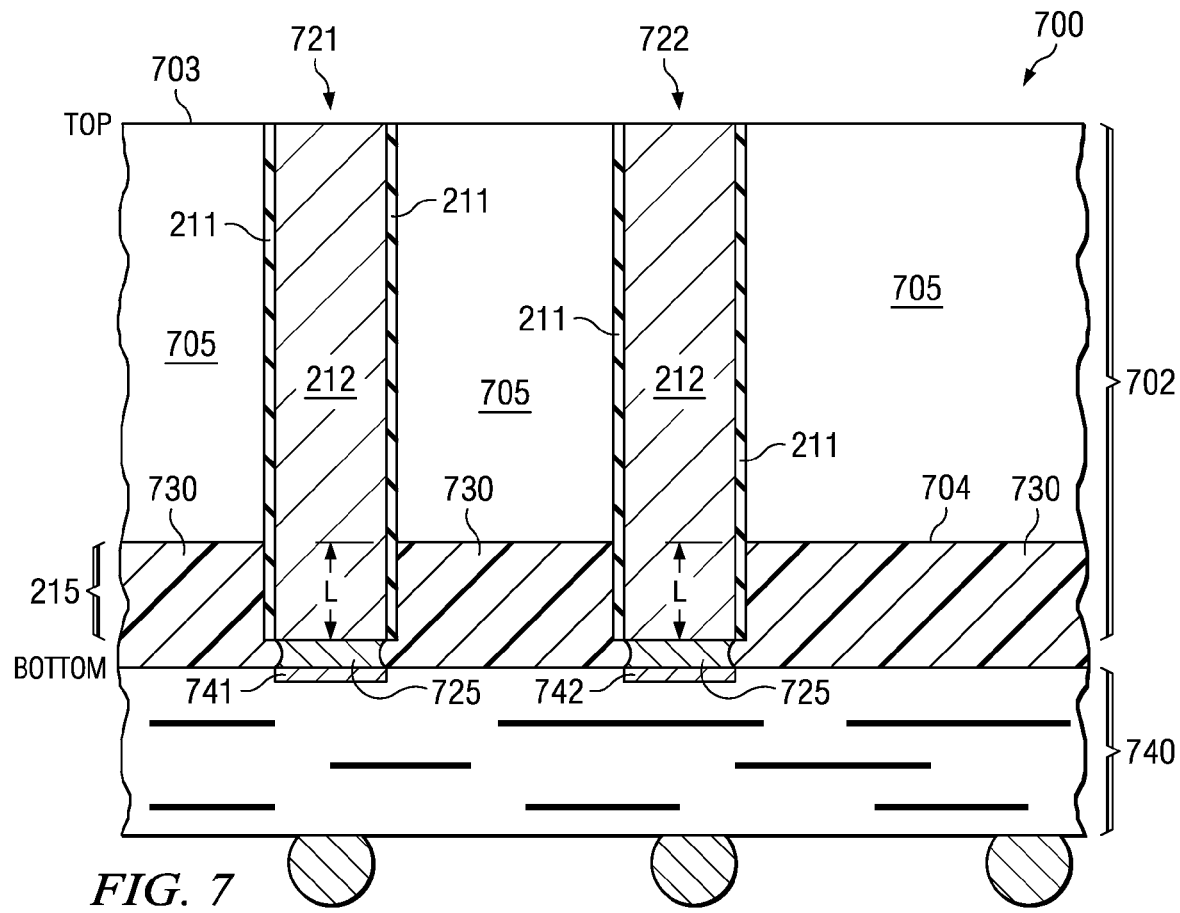
FIG. 7 is a cross sectional depiction of a stacked IC device comprising a first IC die comprising a substrate having a top semiconductor surface providing an active portion for the first IC die and a bottom surface attached via a solder joint to a workpiece.

FIG. 7 is a cross sectional depiction of a stacked IC device 700 comprising a first IC die 702 comprising a substrate 705 having a top semiconductor surface 703 providing an active portion (having function circuitry (not shown)) for the first IC die 702 and a bottom surface 704. IC die 702 includes TSVs 721 and 722 which each comprise a tip 215 extending from the top semiconductor surface 703 to protrude beyond the bottom surface 704 to a tip length (L). The tips 215 have an outer dielectric liner 211, and an electrically conductive portion 212 within the outer dielectric liner 211, and a compliant layer 730 thicker than the tip length (L) attached to the bottom surface 704 of the first IC die 702 lateral to the TSVs 721 and 722. A workpiece 740 that can comprise another IC die or the package substrate (e.g., PCB) 740 shown comprising surface attach pads 741 and 742 is attached to the first IC die 702 by a joint comprising solder material 725 electrically coupling pads 741 and 742 of the PCB 740 to an electrically contactable distal end of the tip 215 of the first IC die 702. The first IC die 702 is exclusive of a redistribution layer (RDL) or other pad comprising layer on the entire bottom surface 704. It can be seen that the joint comprising solder material 725 is confined to a small area proximate to the electrically contactable distal end of the tip 215. During assembly the generally dome shaped solder material described above collapses after reflow, and depending on its volume generally wets the electrically contactable distal end of the tips 215 and the pads 741 and 42 completely resulting in the generally wasp-waist appearance in cross section shown. It can also be seen that the compliant layer 730 does not extend beyond a perimeter of the first IC die 702 (thus no overflow beyond the perimeter of the IC die 702).

Although not shown, additional circuitry can be stacked on the first IC die 702. In one embodiment, one or more additional ICs are stacked on the first IC die 702, such as at least one memory comprising die.

As described above, embodiments of the invention apply an underfill-like material at the wafer or die level, rather than at the package assembly level. Embodiments of the invention apply a solder coating to the distal end of the TSV tip, ready for attachment at the package level rather than relying on the solder to be supplied by the other surface the via tip is attached to (i.e., package substrate or other IC die). Moreover, reflow of the solder coating into a dome shaped bump allows the use of very thin applied solder layers or small solder balls.

Embodiments of the invention provide several significant advantages. Embodiments of the invention eliminate the need to apply underfill in a very small standoff area at the package level which allows eliminating incomplete filling, voiding, resin bleed, and other known conventional underfill process issues. The controlled amount of solder aspect of embodiments of the invention for the TSV attachment process, significantly improves control of solder joint formation and minimizes the possibility of shorted or open connections. The controlled volume of solder will also result in a very thin solder joint, eliminating the need for a further gap filling of the resulting stand-off beyond the compliant layer applied at the wafer level.

Although generally described for backside processing of TSVs, embodiments of the invention may also be extended to processing on the active (i.e. top) surface of the IC die for extended electrically conductive contacts, such as pillars. In a typical example of this embodiment, solder to and an underfill material are applied around metal (e.g. Cu) pillars that are fabricated on the active (i.e. top) surface of the IC die. Pillars may be present on an IC die without TSV's, or on an IC die with TSV's (on opposite sides of the IC die). In the embodiment where the pillar and TSV embodiments are combined, the sequential attach process can be accomplished to keep reflow of an already attached joint from being a problem when reflowing to make the second joint. In one exemplary sequential attach process embodiment, a suitable compliant layer is applied on the side of the IC die containing the TSV's such that it has properties that allow it to "gap fill" under heat/pressure. Next, the TSV's are attached to the mating surface (other IC die). The heat/pressure applied during this step is intended to make the solder joints and also be sufficient to get the compliant layer to gap fill. Finally, the combined 2 (or more) die stack is attached to the package substrate by joining the pillars to the substrate by solder reflow. The joints made in the TSV attachment step are generally contained in area within the area of the compliant layer.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. For example, although embodiments of the invention are generally described for applying solder to and an underfill material around the exposed tip of a TSV, as described above those having ordinary skill in the art will recognize that embodiments of the invention can also be used to apply solder to and an underfill material around metal (e.g. Cu) pillars that are fabricated on certain ICs on the active (i.e. top) surface of the die. Thus, the breadth and scope of the present invention should not be limited by any of the above described embodiments. Rather, the scope of the invention should be defined in accordance with the following claims and their equivalents, as well as the related embodiment comprising application of solder to and an underfill material around metal pillars that are fabricated on the top surface of the IC die.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. § 1.72(b), requiring an abstract that will allow the reader to quickly ascertain the nature of the technical disclosure. It is submitted with the understanding that it will not be used to interpret or limit the scope or meaning of the following claims.

We claim:

1. A method of forming integrated circuit (IC) die configured for attachment to another die or a package substrate, comprising:
    providing at least one IC die having a top semiconductor surface and a bottom surface and at least one through substrate via (TSV) comprising a tip extending from said top semiconductor surface to protrude beyond said bottom surface to a tip length, said tip having an outer dielectric tip liner, and an electrically conductive portion within said outer dielectric tip liner;
    applying a compliant layer, thicker than said tip length, to said bottom surface of said IC die;
    thinning said compliant layer to expose said dielectric tip liner from said distal portion of said tip;
    removing said dielectric tip liner from a distal portion of said tip to form an exposed electrically conductive tip portion;
    depositing a solder material on said exposed electrically conductive tip portion of said tip;
    patterning said solder material using a resist material into an isolated region centered over said tip; and
    reflowing and coalescing said solder material to form a solder bump on said exposed electrically conductive tip portion of said tip.

2. The method of claim 1, wherein said tip length is 5 to 50 μm.

3. The method of claim 1, further comprising a wafer, wherein said wafer comprises a plurality of said IC die.

4. The method of claim 1, further comprising:
    attaching said IC die to another IC die or a package substrate to form solder joints comprising said solder material from said solder bump, wherein said compliant layer becomes interposed between said IC die and said another IC die or said package substrate, said attaching being exclusive of an underfill filling step.

5. The method of claim 1, wherein said reflowing and coalescing reflows said solder material into a dome shaped bump.

6. A method of forming integrated circuit (IC) die configured for attachment to another die or a package substrate, comprising:
    providing at least one IC die having a top semiconductor surface and a bottom surface and at least one through substrate via (TSV) comprising a tip extending from said top semiconductor surface to protrude beyond said bottom surface to a tip length, said tip having an outer dielectric tip liner, and an electrically conductive portion within said outer dielectric tip liner;
    applying a compliant layer, thicker than said tip length, to said bottom surface of said IC die:
    thinning said compliant layer to expose said dielectric tip liner from said distal portion of said tip;
    removing said dielectric tip liner from a distal portion of said tip to form an exposed electrically conductive tip portion;
    forming a blanket metal comprising a seed layer on said bottom surface of said die;
    forming a dielectric layer over said seed layer;
    grinding or polishing said dielectric layer to re-expose said exposed electrically conductive tip portion;
    electroplating a solder material on said exposed electrically conductive tip portion, wherein said dielectric layer acts as an etch mask beyond said tip;
    removing said dielectric layer and said metal comprising seed layer;
    reflowing and coalescing said solder material to form a solder bump on said exposed electrically conductive tip portion of said tip.

7. The method of claim 1, further comprising the step of forming an opening in said compliant layer over said tip having an area larger than said tip before said removing step.

8. The method of claim 7, wherein a laser is used for said forming an opening.

9. The method of claim 7, wherein said depositing comprises electroless deposition of said solder material in said opening.

10. The method of claim 7, wherein said depositing comprises depositing a ball of said solder material in said opening.

11. The method of claim 1, wherein said compliant layer comprises a solder resist, liquid plating resist, a polyimide, or a polybenzoxazole.

* * * * *